(12) United States Patent
Hayes et al.

(10) Patent No.: US 7,847,184 B2
(45) Date of Patent: Dec. 7, 2010

(54) LOW MODULUS SOLAR CELL ENCAPSULANT SHEETS WITH ENHANCED STABILITY AND ADHESION

(75) Inventors: Richard Allen Hayes, Beaumont, TX (US); Geraldine M. Lenges, Wilmington, DE (US); Steven C. Pesek, Orange, TX (US); Jacques Roulin, Vesenaz (CH)

(73) Assignee: E. I. du Pont de Nemours and Company, Wilmington, DE (US)

( * ) Notice: Subject to any disclaimer, the term of this patent is extended or adjusted under 35 U.S.C. 154(b) by 840 days.

(21) Appl. No.: 11/495,391

(22) Filed: Jul. 28, 2006

(65) Prior Publication Data

US 2008/0023064 A1    Jan. 31, 2008

(51) Int. Cl.
*H01L 31/048* (2006.01)
*B32B 27/08* (2006.01)

(52) U.S. Cl. .................. 136/251; 136/244; 156/99; 428/514

(58) Field of Classification Search ............. 136/251
See application file for complete search history.

(56) References Cited

U.S. PATENT DOCUMENTS

| | | | |
|---|---|---|---|
| 3,957,537 A | 5/1976 | Baskett et al. | |
| 5,409,777 A * | 4/1995 | Kennedy et al. | 428/411.1 |
| 5,476,553 A | 12/1995 | Hanoka et al. | |
| 5,478,402 A | 12/1995 | Hanoka | |
| 5,582,653 A | 12/1996 | Kataoka et al. | |
| 5,728,230 A | 3/1998 | Komori et al. | |
| 5,733,382 A | 3/1998 | Hanoka | |
| 5,741,370 A | 4/1998 | Hanoka | |
| 5,762,720 A | 6/1998 | Hanoka et al. | |
| 5,986,203 A | 11/1999 | Hanoka et al. | |
| 6,075,202 A | 6/2000 | Mori et al. | |
| 6,114,046 A * | 9/2000 | Hanoka | 428/515 |
| 6,187,448 B1 | 2/2001 | Hanoka et al. | |
| 6,232,544 B1 | 5/2001 | Takahayashi | |
| 6,319,596 B1 | 11/2001 | Kernander et al. | |
| 6,320,116 B1 | 11/2001 | Hanoka | |
| 6,353,042 B1 | 3/2002 | Hanoka et al. | |
| 6,414,236 B1 | 7/2002 | Kataoka et al. | |

(Continued)

FOREIGN PATENT DOCUMENTS

EP    0 755 080 B1    1/1997

(Continued)

OTHER PUBLICATIONS

U.S. Appl. No. 11/386,143, filed Mar. 21, 2006. Inventor Hasch.

(Continued)

*Primary Examiner*—Jennifer K Michener
*Assistant Examiner*—Jayne Mershon
(74) *Attorney, Agent, or Firm*—Arne R. Jarnolm; Tong Li; Mark D. Kuller

(57) ABSTRACT

The present invention provides a thermoplastic film or sheet comprising two surface layers made of acid copolymers, or ionomers, or combinations thereof and at least one inner layer made of ethylene acrylate ester copolymers, a solar cell module comprising at least one encapsulant layer derived therefrom, and a process of manufacturing the solar cell module.

32 Claims, 1 Drawing Sheet

U.S. PATENT DOCUMENTS

| | | |
|---|---|---|
| 6,586,271 B2 | 7/2003 | Hanoka |
| 6,690,930 B1 | 2/2004 | Dupre |
| 6,693,237 B2 | 2/2004 | Zenko et al. |
| 6,940,008 B2 | 9/2005 | Shiotsuka et al. |
| 7,479,327 B2 * | 1/2009 | Domine ............ 428/523 |
| 2003/0000568 A1 | 1/2003 | Gonsiorawski |
| 2003/0124296 A1 | 7/2003 | Smith |
| 2004/0144415 A1 | 7/2004 | Arhart |
| 2004/0191422 A1 | 9/2004 | Kataoka et al. |
| 2005/0279401 A1 * | 12/2005 | Arhart et al. ............ 136/251 |
| 2006/0057392 A1 | 3/2006 | Smillie et al. |
| 2006/0084763 A1 | 4/2006 | Arhart et al. |
| 2006/0141212 A1 | 6/2006 | Smith et al. |
| 2006/0165929 A1 | 7/2006 | Lenges et al. |

FOREIGN PATENT DOCUMENTS

| | | |
|---|---|---|
| EP | 1 544 932 A1 | 6/2005 |
| JP | S58-17685(A) | 2/1983 |
| JP | H2-94574(A) | 4/1990 |
| JP | 05-186610 * | 1/1992 |
| JP | 35-10645 B2 | 10/1994 |
| JP | 06-322334 A | 11/1994 |
| JP | 35-10646 B1 | 11/1994 |
| JP | 08-316508 A | 11/1996 |
| JP | 11-026791 A | 1/1999 |
| JP | 2000-186114 A | 7/2000 |
| JP | 2001-089616 A | 4/2001 |
| JP | 2001-119047 A | 4/2001 |
| JP | 2001-119056 A | 4/2001 |
| JP | 2001-119057 A | 4/2001 |
| JP | 2001144313 A | 5/2001 |
| JP | 2004-031445 A | 1/2004 |
| JP | 2005-034913 | 2/2005 |
| JP | 2005-064266 | 3/2005 |
| JP | 2005-064268 | 3/2005 |
| JP | 2006-032308 A | 2/2006 |
| JP | 2006-036874 A | 2/2006 |
| JP | 2006-036875 A | 2/2006 |
| JP | 2006-036876 A | 2/2006 |
| JP | 2006-186233 A | 7/2006 |
| JP | 2006-186237 A | 7/2006 |
| JP | 2006-190865 A | 7/2006 |
| JP | 2006-190867 A | 7/2006 |
| WO | 2006/085603 A1 | 8/2006 |
| WO | 2006/095762 A1 | 9/2006 |

OTHER PUBLICATIONS

U.S. Appl. No. 11/491,341, filed Jul. 21, 2006, Inventors Anderson et al.

U.S. Appl. No. 11/495,249, filed Jul. 28, 2006, Inventors Hayes et al.

U.S. Appl. No. 11/796,858, filed Apr. 30, 2007, Inventor Hayes.

Baum, Bernard, et al., in "Solar Collectors. Final Report", DOE/CS/35359-T1 (DE84011480), DOE6081.1, Contract No. AC4-78CS35359, (Springborn Laboratories, Inc.), Jun. 1983.

Willis, Paul B., in "Investigation of Materials and Processes for Solar Cell Encapsulation", DOE/JPL-954527-86/29, JPL Contract 954527, S/L Project 6072.1, Aug. 1986.

* cited by examiner

LOW MODULUS SOLAR CELL ENCAPSULANT SHEETS WITH ENHANCED STABILITY AND ADHESION

FIELD OF THE INVENTION

The present invention relates to low modulus solar cell encapsulant layers with enhanced stability and adhesion. More specifically, the present invention relates to a thermoplastic film or sheet prepared from certain resin compositions suitable for use as an encapsulant layer in solar cell laminate articles.

BACKGROUND OF THE INVENTION

As a renewable energy resource, the use of solar cell modules is rapidly expanding. With increasingly complex solar cell modules, also referred to as photovoltaic modules, comes an increased demand for enhanced functional encapsulant materials. Photovoltaic (solar) cell modules are units that convert light energy into electrical energy. Typical or conventional construction of a solar cell module consists of at least 5 structural layers. The layers of a conventional solar cell module are constructed in the following order starting from the top, or incident layer (that is, the layer first contacted by light) and continuing to the backing (the layer furthest removed from the incident layer): (1) incident layer or front-sheet, (2) front-sheet (or first) encapsulant layer, (3) voltage-generating layer (or solar cell layer), (4) back-sheet (second) encapsulant layer, and (5) backing layer or back-sheet. The function of the incident layer is to provide a transparent protective window that will allow sunlight into the solar cell module. The incident layer is typically a glass plate or a thin polymeric film, such as a fluoropolymer film, but could conceivably be any material that is transparent to sunlight.

The encapsulant layers of solar cell modules are designed to encapsulate and protect the fragile voltage-generating layer. Generally, a solar cell module will incorporate at least two encapsulant layers sandwiched around the voltage-generating layer. The optical properties of the front-sheet encapsulant layer must be such that light can be effectively transmitted to the voltage-generating layer. Over the years, a wide variety of polymeric interlayers have been developed to be used as encapsulant layers. In general, these polymeric interlayers must possess a combination of characteristics including very high optical clarity, low haze, high impact resistance, shock absorbance, excellent ultraviolet (UV) light resistance, good long term thermal stability, excellent adhesion to glass and other solar cell laminate layers, low UV light transmittance, low moisture absorption, high moisture resistance, excellent long term weatherability, among other requirements. Encapsulant materials that are either currently utilized in the field or suggested to be useful include complex, multicomponent compositions based on ethylene vinyl acetate (EVA), ionomer, polyvinylbutyral (PVB), thermoplastic polyurethane (TPU), polyvinylchloride (PVC), metallocene-catalyzed linear low density polyethylenes, polyolefin block elastomers, ethylene acrylate ester copolymers, such as poly(ethylene-co-methyl acrylate) and poly(ethylene-co-butyl acrylate), acid copolymers, silicone elastomers, epoxy resins, and the like.

EVA compositions, which have commonly been utilized as the encapsulant layer within solar cell modules, suffer the shortcomings of low adhesion to the other components incorporated within the solar cell module, low creep resistance during the lamination process and end-use and low weathering and light stability. These shortcomings have generally been overcome through the formulation of adhesion primers, peroxide curing agents, and thermal and UV stabilizer packages into the EVA compositions, which complicates the sheet production and ensuing lamination processes.

A more recent development has been the use of higher modulus ethylene copolymer ionomers within solar cell construction. For example, Maruyama, et. al. in Japanese Patent No. JP S56-116047, have disclosed a bi-layer encapsulant layer wherein the first layer is derived from EVA with a low VA content (20 wt % or lower), polyethylene, or soft PVC and the second layer derived from ionomer or EVA with high VA content (20 wt % or higher). Also exemplified is an ionomer/EVA bi-layer for use as an encapsulant layer, with the ionomer surface in contact with the outer solar cell layers, such as glass.

Okaniwa, et. al., in Japanese Patent No. JP H2-94574(A), have disclosed embossed films, such as PET film, to diffuse the incident light going into the solar cell. They further disclose "a tacky adhesive film layer" encapsulant, such as EVA, PVB, ionomer and polyethylene resins, with an encapsulant thickness of between 20 and 300 μm (0.8-11 mils).

Baum, Bernard, et. al., in "Solar Collectors. Final Report", DOE/CS/35359-T1 (DE84011480), DOE6081.1, Contract No. AC4-78CS35359 (Springborn Laboratories, Inc.), June, 1983, have disclosed a list of usable solar cell encapsulant materials which include ethylene acrylic acid, EAA-435® (a product of Dow Chemical Co.) and ionomer, Surlyn® 1707 (a product of E. I. du Pont de Nemours and Company).

U.S. Pat. Nos. 5,476,553; 5,478,402; and 5,733,382 have disclosed the use of encapsulant layers derived from ionomers formed by the partial neutralization of ethylene-methacrylic acid copolymers or ethylene-acrylic acid copolymers with inorganic bases and the use of Surlyn® 1601 and Surlyn® 1707 (E. I. du Pont de Nemours and Company).

U.S. Pat. Nos. 5,741,370; 5,762,720 and 5,986,203 have disclosed a solar cell module back-sheet which is a thermoplastic polyolefin including a mixture of at least two ionomers.

U.S. Pat. Nos. 6,114,046 and 6,353,042, have disclosed a solar cell laminate encapsulant material which includes a layer of metallocene polyethylene disposed between two layers of ionomer.

U.S. Pat. No. 6,319,596 has disclosed a solar cell encapsulant layer comprising a polyolefin with an ionomer surface.

U.S. Pat. Nos. 6,320,116 and 6,586,271 have disclosed solar cell encapsulant layers with reduced creep through treatment with electron beam radiation.

U.S. Pat. No. 6,690,930 and US Patent Application No. 2003/0000568, have disclosed the use of Surlyn® 1705-1 and Surlyn® 1706 (E. I. du Pont de Nemours and Company) zinc ionomers as solar cell encapsulants.

However, none of the currently known encapsulant layer materials can encompass all of the end-use requirements. Ionomer compositions have excellent weatherability and adhesion to other solar cell laminate layers, such as glass, but tend to be high modulus with reduced shock absorbance imparted to the solar cell.

There is a continuing need to provide solar cell encapsulant layers which provide adequate protection to the solar cell, have a long lifetime within the end-use and provide adequate adhesion to the other solar cell laminate layers, preferably without the use of adhesion primers to simplify the production processes. The use of certain ethylene acrylate ester copolymers as solar cell encapsulants has been considered since essentially the inception of solar cell modules. For example, U.S. Pat. No. 3,957,537, has disclosed certain solar cell adhesives which include ethylene copolymers. U.S. Pat.

Nos. 5,582,653; 5,728,230; 6,075,202; 6,232,544; and 6,940,008, European Patent Nos. EP 0 755 080 and EP 1 544 921, and US Patent Application No. 2004/0191422 have disclosed ethylene/methyl acrylate (EMA) and ethylene/ethyl acrylate (EEA) as filler materials for photovoltaic devices.

However, it has generally been found that ethylene acrylate esters do not provide adhesion to commonly utilized solar cell structural layers, such as glass. Ethylene acrylate copolymers are also not typically optically clear. For the very same reason, U.S. Pat. Nos. 6,414,236 and 6,693,237 teach against the use of ethylene acrylate ester copolymers as solar cell encapsulants. This shortcoming has usually been overcome through the addition of adhesion primers. In addition, the ethylene acrylate ester materials have been found to creep under end-use conditions, such as in roof solar cell modules which can reach high temperatures. To overcome this shortcoming, the ethylene acrylate esters have been cross-linked, typically through the incorporation of organic peroxides with concurrent curing processes thereafter. For example, Willis, Paul B., in "Investigation Of Materials And Processes For Solar Cell Encapsulation", DOE/JPL-954527-86/29, JPL Contract 954527, S/L Project 6072.1, August, 1986, disclose solar cell encapsulants derived from peroxide cross-linked EMA, which requires the use of a primer for effective and reliable bonding to the other components.

Tailored multilayer solar cell encapsulant layers have been developed to provide each layer's best attributes, while reducing their shortcomings. However, care must be taken when designing multilayer solar cell encapsulant layers to avoid unforeseen shortcomings which detract from the overall desirability of the resultant encapsulant layer. For example, U.S. Pat. Nos. 6,114,046; 6,586,271; and 6,353,042 have disclosed a solar cell encapsulant sheet which includes a layer of metallocene polyethylene disposed between two layers of ionomer and U.S. Pat. Nos. 6,187,448 and 6,320,116 have disclosed a solar cell encapsulant sheet which includes a layer of metallocene polyethylene disposed between two layers of an acid copolymer of polyethylene. In both cases, the tri-layer encapsulant sheet suffers the shortcoming of appearing cloudy and light blue.

The present invention overcomes these shortcoming and provides tailored, low modulus multilayer solar cell encapsulant sheets which provide excellent protection to the solar cell from physical damage, excellent adhesion to the other solar cell laminate layers, and long term stability to thermal and UV degradation.

SUMMARY OF THE INVENTION

This invention is directed to a thermoplastic film or sheet comprising two surface layers derived from acid copolymers and/or ionomers and at least one inner layer derived from ethylene acrylate ester copolymers.

In another aspect, the present invention is directed to a solar cell module or laminate comprising a first encapsulant layer derived from the thermoplastic film or sheet described above, an optional second encapsulant layer, and a solar cell layer comprising one or a plurality of electronically interconnected solar cells, wherein the first and optional second encapsulant layers are laminated to each of the two surfaces of the solar cell layer. Preferably, the first encapsulant layer is laminated to the light-receiving surface of the solar cell layer. Moreover, the solar cell module may further comprise a transparent incident layer and a back-sheet.

In yet another aspect, the present invention is directed to a solar cell module or laminate consisting essentially of, from top to bottom, an incident layer made of transparent material, a first encapsulant layer derived from the thermoplastic film or sheet described above, a solar cell layer comprising one or a plurality of electronically interconnected solar cells, an optional second encapsulant layer, and a back-sheet.

In a still further aspect, the present invention is directed to a process of manufacturing the solar cell modules or laminates described above.

DETAILED DESCRIPTION OF THE INVENTION

To the extent permitted by the United States law, all publications, patent applications, patents, and other references mentioned herein are incorporated by reference in their entirety.

The materials, methods, and examples herein are illustrative only and the scope of the present invention should be judged only by the claims.

Definitions

The following definitions apply to the terms as used throughout this specification, unless otherwise limited in specific instances.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range.

When the term "about" is used in describing a value or an end-point of a range, the disclosure should be understood to include the specific value or end-point referred to.

The terms "finite amount" and "finite value", as used herein, are interchangeable and refer to an amount that is greater than zero.

In the present application, the terms "sheet" and "film" are used in their broad sense interchangeably.

Thermoplatic Films and Sheets

Figure 1:
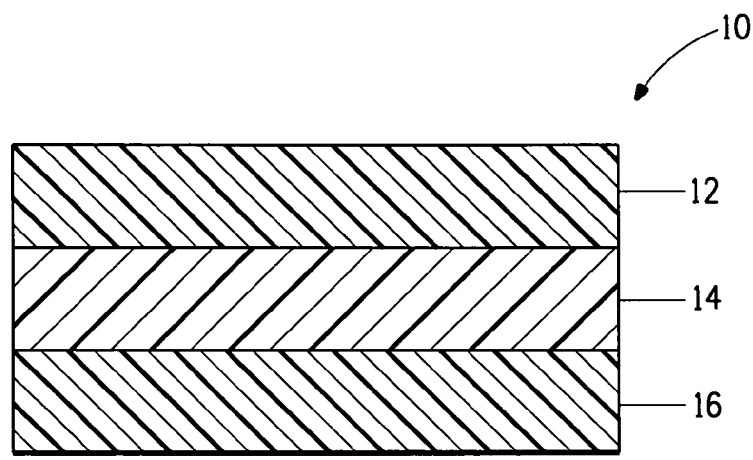
FIG. 1 is a cross-sectional view of one particular embodiment of the thermoplastic film or sheet 10 of the present invention, which comprises two surface layers 12 and 16 and one inner layer 14.

Referring now to FIG. 1, one embodiment of the present invention is a thermoplastic film or sheet 10 suitable for use in laminar structures. The thermoplastic film or sheet 10 may be used as a solar cell encapsulant layer, which can be heated and be caused to form an adhesive bond with other encapsulant layer materials, flexible plastic materials, rigid materials, and/or solar cells.

The thermoplastic film or sheet 10 comprises two surface layers 12 and 16 and at least one inner layer 14, wherein (i) each of the two surface layers 12 and 16 comprises a polymeric composition comprising an acid copolymer, an ionomer, or a combination thereof and (ii) the at least one inner layer 14 comprises a polymeric composition comprising an ethylene acrylate ester copolymer (FIG. 1).

In one particular embodiment, the two surface layers 12 and 16 are chemically distinct from each other. By "chemically distinct", it is meant that the two surface layers 12 and 16 are derived from chemically distinct polymeric compositions. For example, polymeric compositions comprising acid copolymers are chemically distinct from polymeric compositions comprising ionomers. Moreover, two acid copolymeric compositions or two ionomeric compositions are chemically distinct if 1) one or both of the comonomers comprised in each composition are different in their chemical structure and/or content level, or 2) one or both of the copolymeric compositions further comprise one or more distinct termonomers or 3) the copolymeric compositions have different molecular weights, of 4) in the example of ionomeric compositions, the carboxylic acids in each of compositions are neutralized with different metallic ions and/or at different levels.

I. Acid Copolymers:

In accordance to the present invention, the acid copolymer used herein is a copolymer comprising a finite amount of polymerized residues of an α-olefin and greater than or equal to about 1 wt % of polymerized residues of an α, β-ethylenically unsaturated carboxylic acid based on the total weight of the acid copolymer. Preferably, the acid copolymer contains greater than or equal to about 10 wt %, or more preferably, greater than or equal to about 18 wt %, or most preferably, about 18 to about 23 wt % of the α, β-ethylenically unsaturated carboxylic acid to provide enhanced adhesion, clarity, percent light transmission and physical properties, such as higher flexural moduli and stiffness.

The α-olefin used herein incorporates from 2 to 10 carbon atoms. The α-olefin may be selected from the group consisting of ethylene, propylene, 1-butene, 1-pentene, 1-hexene, 1-heptene, 3-methyl-1-butene, 4-methyl-1-pentene, and the like and mixtures thereof. Preferably, the α-olefin is ethylene. The α, β-ethylenically unsaturated carboxylic acid used herein may be selected from the group consisting of acrylic acids, methacrylic acids, itaconic acids, maleic acids, maleic anhydrides, fumaric acids, monomethyl maleic acids, and mixtures thereof. Preferably, the α, β-ethylenically unsaturated carboxylic acid is selected from the group consisting of acrylic acids, methacrylic acids and mixtures thereof.

The acid copolymer may further comprise polymerized residues of at least one other unsaturated comonomer. Specific examples of such other unsaturated comonomers include, but are not limited to, methyl acrylate, methyl methacrylate, ethyl acrylate, ethyl methacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol) acrylate, poly(ethylene glycol)methacrylate, poly(ethylene glycol) methyl ether acrylate, poly(ethylene glycol) methyl ether methacrylate, poly(ethylene glycol) behenyl ether acrylate, poly(ethylene glycol) behenyl ether methacrylate, poly (ethylene glycol) 4-nonylphenyl ether acrylate, poly(ethylene glycol) 4-nonylphenyl ether methacrylate, poly(ethylene glycol) phenyl ether acrylate, poly(ethylene glycol) phenyl ether methacrylate, dimethyl maleate, diethyl maleate, dibutyl maleate, dimethyl fumarate, diethyl fumarate, dibutyl fumarate, dimenthyl fumarate and the like and mixtures thereof. Preferably, the other unsaturated comonomers are selected from the group consisting of methyl acrylate, methyl methacrylate, butyl acrylate, butyl methacrylate, glycidyl methacrylate and mixtures thereof. The acid copolymers used herein may incorporate from 0 to about 50 wt % of polymerized residues of the other unsaturated comonomers, based on the total weight of the composition. Preferably, the acid copolymers used herein incorporate from 0 to about 30 wt %, or more preferably, from 0 to about 20 wt % of polymerized residues of the other unsaturated comonomers. The acid copolymers used herein may be polymerized as disclosed, for example, in U.S. Pat. Nos. 3,404,134; 5,028,674; 6,500,888; and 6,518,365.

II. Ionomers:

The ionomers used herein are derived from certain of the above mentioned acid copolymers. The ionomers of the present invention may contain greater than or equal to about 10 wt % of polymerized residues of α, β-ethylenically unsaturated carboxylic acids based on the total weight of the parent acid copolymers. Preferably, the ionomers contain greater than or equal to about 15 wt %, or more preferably, greater than or equal to about 18 wt %, or yet more preferably, greater than or equal to about 20 wt %, or most preferably, from about 20 to about 25 wt % of polymerized residues of α, β-ethylenically unsaturated carboxylic acids to provide enhanced adhesion, clarity, percent light transmission and physical properties, such as higher flexural moduli and stiffness.

It is noted that the ionomer resins used herein provide the films or sheets derived therefrom with improved toughness relative to what would be expected of a shaped article comprising a higher acid content. It is believed that improved toughness in the present invention is obtained by preparing a parent acid copolymer base resin with a lower melt index (MI) before it is neutralized. The parent acid copolymer resin of the present invention preferably has a MI of less than 60 g/10 min, or more preferably, less than 55 g/10 min, or even more preferably, less than 50 g/10 min, or most preferably, less than 35 g/10 min, as determined at 190° C. The MI can be measured by any standard test, such as test methods ISO 1133 and ASTM D1238, which are generally conducted at a temperature of 190° C. with a load of 2160 g.

To form the ionomers, the parent acid copolymers may be neutralized from about 10% to about 100% with metallic ions based on the total carboxylic acid content. Preferably, parent acid copolymers are from about 10% to about 50%, or more preferably, from about 20% to about 40% neutralized with metallic ions. The metallic ions may be monovalent, divalent, trivalent, multivalent, or mixtures of ions having the same or different valencies. Exemplary monovalent metallic ions include, but are not limited to, sodium, potassium, lithium, silver, mercury, copper, and the like and mixtures thereof. Exemplary divalent metallic ions include, but are not limited to, beryllium, magnesium, calcium, strontium, barium, copper, cadmium, mercury, tin, lead, iron, cobalt, nickel, zinc, and the like and mixtures thereof. Exemplary trivalent metallic ions include, but are not limited to, aluminum, scandium, iron, yttrium, and the like and mixtures thereof. Exemplary multivalent metallic ions include, but are not limited to, titanium, zirconium, hafnium, vanadium, tantalum, tungsten, chromium, cerium, iron, and the like and mixtures thereof. Notably, when the metallic ion is multivalent, complexing agents, such as stearate, oleate, salicylate, and phenolate radicals are included, as disclosed within U.S. Pat. No. 3,404,134. Preferably, the metallic ion may be selected from the group consisting of sodium, lithium, magnesium, zinc, aluminum, and mixtures thereof. More preferably, the metallic ion may be selected from the group consisting of sodium, zinc, and mixtures thereof. Most preferably, the metallic ion is zinc. The parent acid copolymers of the present invention may be neutralized as disclosed, for example, in U.S. Pat. No. 3,404,134.

The ionomers used herein preferably have a MI less than about 10 g/10 min, as measured by ASTM method D1238 at 190° C., to reduce resin creep (flow) during the lamination process and within the end-use. More preferably, the ionomers have a MI less than about 5 g/10 min, or most preferably, less than about 3 g/10 min. The ionomers also preferably have a flexural modulus greater than about 40,000 psi, as measured by ASTM method D638. More preferably, the ionomers have a flexural modulus greater than about 50,000 psi, and most preferably, greater than about 60,000 psi.

III. Ethylene Acrylate Ester Copolymers:

In accordance to the present invention, the ethylene acrylate ester copolymer is a copolymer comprising finite amounts of polymerized residues of an α-olefin and polymerized residues of an acrylate ester. Preferably, the α-olefin is ethylene.

Specific examples of preferable acrylate ester comonomers include, but are not limited to, methyl acrylate, methyl methacrylate, ethyl acrylate, ethyl ethacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol) acrylate, poly(ethylene glycol)methacrylate, poly(ethylene glycol) methyl ether acrylate, poly(ethylene glycol) methyl ether methacrylate, poly(ethylene glycol) behenyl ether acrylate, poly(ethylene glycol) behenyl ether methacrylate, poly(ethylene glycol) 4-nonylphenyl ether acrylate, poly(ethylene glycol) 4-nonylphenyl ether methacrylate, poly(ethylene glycol) phenyl ether acrylate, poly(ethylene glycol) phenyl ether methacrylate, dimethyl maleate, diethyl maleate, dibutyl maleate, dimethyl fumarate, diethyl fumarate, dibutyl fumarate, dimenthyl fumarate, and the like and combinations thereof. Specific examples of more preferable acrylate ester comonomers include methyl acrylate, ethyl acrylate, isopropyl acrylate, butyl acrylate and combinations thereof.

The ethylene acrylate ester copolymers used herein may comprise at least 1 wt % or more of polymerized residues of acrylate ester comonomers, based on the total weight of the composition. Preferably, the ethylene acrylate ester copolymers of the present invention comprise greater than or equal to about 15 wt %, or more preferably, greater than or equal to about 20 wt %, or even more preferably, greater than or equal to about 25 wt %, or yet even more preferably, greater than or equal to about 30 wt %, or most preferably, about 30 to about 40 wt % of polymerized residues of acrylate ester comonomers to provide enhanced clarity, percent light transmission and physical properties, such as a reduced modulus and flexibility.

The ethylene acrylate ester copolymers used herein may have a tensile modulus equal to or less than about 10,000 psi to afford good physical shock protection for the solar cell. The tensile modulus may be measured through any known art method, for example, test methods ISO 527-2 (1 mm/min) and ASTM D638. Preferably, the ethylene acrylate ester copolymers of the present invention have a tensile modulus equal to or less than about 7,500 psi, or more preferably, equal to or less than about 5,000 psi, or most preferably, equal to or less than about 3,000.

The ethylene acrylate ester copolymers may have a MI of any value that is desired. Preferably the ethylene acrylate ester copolymers of the present invention have a MI less than about 60 g/10 min, or more preferably, less than about 30 g/10 min, or most preferably, less than about 15 g/10 min as determined at 190° C. In a particular embodiment of the present invention, whereby the ethylene acrylate ester copolymers are not cross-linked, the MI preferably may be less than about 5 g/10 min, or more preferably less than about 3 g/10 min, or most preferably less than about 2 g/10 min.

IV. Additives:

The polymeric compositions used in the thermoplastic film or sheet 10 of the present invention, or its sub-layers 12, 14, and 16, may further contain additives which effectively reduce the melt flow of the resin, to the limit of producing thermoset films or sheets. The use of such additives will enhance the upper end-use temperature and reduce creep of the encapsulant layer and laminates of the present invention, both during the lamination process and the end-uses thereof. Typically, the end-use temperature will be enhanced up to 20° C. to 70° C. In addition, laminates produced from such materials will be fire resistant. By reducing the melt flow of the thermoplastic films or sheets of the present invention, the material will have a reduced tendency to melt and flow out of the laminate and therefore less likely to serve as additional fire fuel. Specific examples of melt flow reducing additives include, but are not limited to, organic peroxides, such as 2,5-dimethylhexane-2,5-dihydroperoxide, 2,5-dimethyl-2,5-di(tert-betylperoxy)hexane-3, di-tert-butyl peroxide, tert-butylcumyl peroxide, 2,5-dimethyl-2,5-di(tert-butylperoxy) hexane, dicumyl peroxide, alpha, alpha'-bis(tert-butylperoxyisopropyl)benzene, n-butyl-4,4-bis(tert-butylperoxy) valerate, 2,2-bis(tert-butylperoxy)butane, 1,1-bis(tert-butylperoxy)cyclohexane, 1,1-bis(tert-butylperoxy)-3,3,5-trimethyl-cyclohexane, tert-butyl peroxybenzoate, benzoyl peroxide, and the like and mixtures or combinations thereof. The organic peroxide may decompose at a temperature of about 100° C. or higher to generate radicals. Preferably, the organic peroxides have a decomposition temperature which affords a half life of 10 hours at about 70° C. or higher to provide improved stability for blending operations. Typically, the organic peroxides will be added at a level of between about 0.01 and about 10 wt % based on the total weight of composition. If desired, initiators, such as dibutyltin dilaurate, may be used. Typically, initiators are added at a level of from about 0.01 to about 0.05 wt % based on the total weight of composition. If desired, inhibitors, such as hydroquinone, hydroquinone monomethyl ether, p-benzoquinone, and methylhydroquinone, may be added for the purpose of enhancing control to the reaction and stability. Typically, the inhibitors would be added at a level of less than about 5 wt % based on the total weight of the composition. However, for the sake of process simplification and ease, it is preferred that the thermoplastic films or sheets 10 of the present invention do not incorporate cross-linking additives, such as the above-mentioned peroxides.

It is understood that the polymeric compositions used in the thermoplastic film or sheet 10 of the present invention, or its sub-layers 12, 14, and 16, may further contain any additive known within the art. Such exemplary additives include, but are not limited to, plasticizers, processing aides, flow enhancing additives, lubricants, pigments, dyes, flame retardants, impact modifiers, nucleating agents to increase crystallinity, antiblocking agents such as silica, thermal stabilizers, hindered amine light stabilizers (HALS), UV absorbers, UV stabilizers, dispersants, surfactants, chelating agents, coupling agents, adhesives, primers, reinforcement additives, such as glass fiber, fillers and the like.

Thermal stabilizers are well disclosed within the art. Any known thermal stabilizer will find utility within the present invention. General classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O—, N— and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds which destroy peroxide, hydroxylamines, nitrones, thiosynergists, benzofuranones, indolinones, and the like and mixtures thereof. The polymeric compositions disclosed herein may comprise 0 to about 10.0 wt % of the thermal stabilizers, based on the total weight of the composition. Preferably, the polymeric compositions disclosed herein comprise 0 to about 5.0 wt %, or more preferably, 0 to about 1.0 wt % of the thermal stabilizers.

UV absorbers are well disclosed within the art. Any known UV absorber will find utility within the present invention. Preferable general classes of UV absorbers include, but are not limited to, benzotriazoles, hydroxybenzophenones, hydroxyphenyl triazines, esters of substituted and unsubstituted benzoic acids, and the like and mixtures thereof. The polymeric compositions disclosed herein may comprise 0 to about 10.0 wt % of the UV absorbers, based on the total weight of the composition. Preferably, the polymeric compositions disclosed herein comprise 0 to about 5.0 wt %, or more preferably, 0 to about 1.0 wt % of the UV absorbers.

Generally, HALS are disclosed to be secondary, tertiary, acetylated, N-hydrocarbyloxy substituted, hydroxy substituted N-hydrocarbyloxy substituted, or other substituted cyclic amines which further incorporate steric hindrance, generally derived from aliphatic substitution on the carbon atoms adjacent to the amine function. Essentially any HALS known within the art may find utility within the present invention. The polymeric compositions disclosed herein may comprise 0 to about 10.0 wt % of HALS, based on the total weight of the composition. Preferably, the polymeric compositions disclosed herein comprise 0 to about 5.0 wt %, or more preferably, 0 to about 1.0 wt % of HALS.

Silane coupling agent may be added in the polymeric compositions to enhance the adhesive strengths. Specific examples of the silane coupling agents include, but are not limited to, gamma-chloropropylmethoxysilane, vinyltriethoxysilane, vinyltris(beta-methoxyethoxy)silane, gamma-methacryloxypropylmethoxysilane, vinyltriacetoxysilane, gamma-glycidoxypropyltrimethoxysilane, gamma-glycidoxypropyltriethoxysilane, beta-(3,4-epoxycyclohexyl)ethyltrimethoxysilane, vinyltrichlorosilane, gamma-mercaptopropylmethoxysilane, gamma-aminopropyltriethoxysilane, N-beta-(aminoethyl)-gamma-aminopropyltrimethoxysilane, and the like and mixtures thereof. These silane coupling agent materials may be used at a level of about 5 wt % or less, or preferably, about 0.001 to about 5 wt %, based on the total weight of the resin composition.

V. Manufacture:

In accordance to the present invention, the thermoplastic films or sheets 10 described above, may be produced through any known process. This may include the use of preformed ethylene acrylate ester copolymer films or sheets and ionomer or acid copolymer films or sheets, laminates thereof, extrusion coated multilayer films or sheets, co-extrusion casting and blown film processes. Generally, the films or sheets are produced through extrusion casting or blown film processes.

Solar Cell Modules or Laminates

In another embodiment, the present invention is a solar cell module or a solar cell laminate comprising (i) a solar cell layer comprising one or a plurality of electronically interconnected solar cells, (ii) a first encapsulant layer derived from the thermoplastic film or sheet 10 of the present, and (iii) an optional second encapsulant layer, wherein the first and optional second encapsulant layers are laminated to each of the two opposite surfaces of the solar cell layer.

Figure 2:
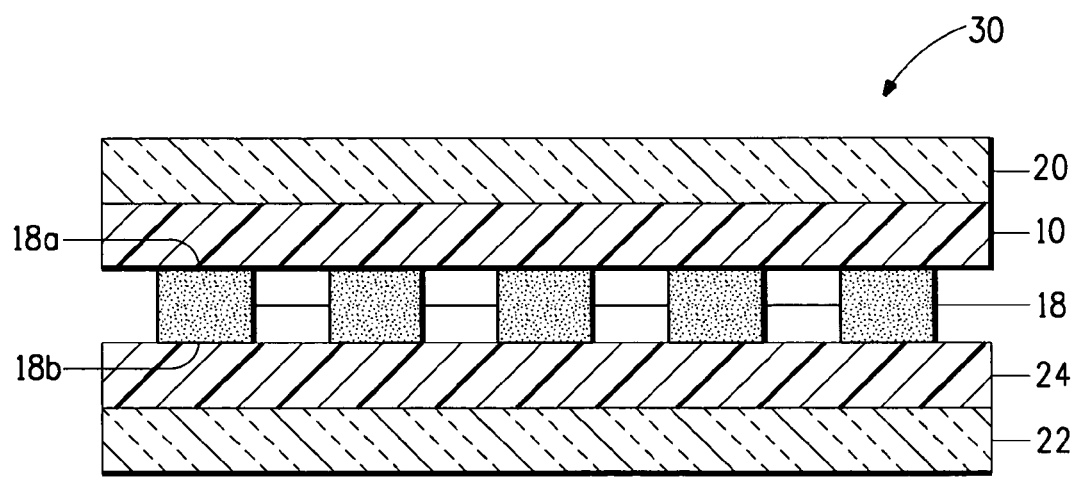
FIG. 2 is a cross-sectional view of one particular embodiment of the solar cell module or laminate 30 of the present invention, which comprises from top to bottom an incident layer 20, a first encapsulant layer 10 (as shown and described in correlation with FIG. 1), a solar cell layer 18, an optional second encapsulant layer 24, and a back-sheet 22.

Now referring to one particular embodiment of the present invention, as illustrated in FIG. 2, the solar cell module or laminate 30 comprises a solar cell layer 18, a first encapsulant layer 10, and an optional second encapsulant layer 24, wherein (i) the solar cell layer 18 comprises one or a plurality of electronically interconnected solar cells and has two opposite surfaces, a light-receiving surface 18a and a rear surface 18b, (ii) the first encapsulant layer comprises the thermoplastic film or sheet 10 of the present invention and is laminated to the light-receiving surface of the solar cell layer 18a, and (iii) the optional second encapsulant layer 24 is laminated to the rear surface of the solar cell layer 18b.

The solar cell module or laminate 30 of the present invention may further comprise a transparent incident layer (front sheet) 20, such as a layer of glass, wherein the incident layer 20 is laminated to the first encapsulant layer 10 and away from the solar cell layer 18.

The solar cell module or laminate of the present invention may also comprise a back-sheet 22, wherein the back-sheet 22 is laminated to the rear surface of the solar cell layer 18b or, when an optional second encapsulant layer 24 is present, the back-sheet 22 is laminated to the second encapsulant layer 24 and away from the solar cell layer 18.

Also within the scope of the present invention, the solar cell modules or laminates may further comprise one or more additional encapsulant layers and/or other additional layers of films or sheets.

The encapsulant layer derived from the thermoplastic film or sheet 10 of the present invention provides many desirable benefits to the overall solar cell module and the process to produce the solar cell laminate. The surface layers 12 and 16, which are made of ionomers and/or acid copolymers, provide excellent adhesion to the other solar cell laminate layers, especially to the rigid support layers, such as the glass layer, without the need for the incorporation of adhesion promoters and additives. The ionomers and/or acid copolymers further provide sheets or films having surfaces which are tack-free and do not block when rolled or stacked in storage or when manipulated during the production of the solar cell laminates. As the inner layer 14 is derived from soft, low modulus ethylene acrylate ester copolymers and has a tendency to block and stick, the surface layers 12 and 16 also protect the inner layer 14 from having intimate surface contact with itself. On the other hand, as the acid copolymers and ionomers tend to be rigid and have a high modulus, the incorporation of the ethylene acrylate ester copolymer inner layer 14 substantially enhances the overall flexibility of the encapsulant layer and lowers the modulus to provide adequate physical shock protection for the fragile solar cell components. In a particular embodiment, none of the layers contained within the solar cell encapsulant layers of the present invention are cross-linked. As a further benefit, the expensive stabilizers, such as the UV absorbers, may be concentrated in the acid copolymer and/or ionomer layers that are in contact with the incident layer, where the lowest overall concentration can most efficiently protect the overall multilayer encapsulant film or sheet and, in turn, the solar cell laminate.

I. Encapsulant Layers:

The first encapsulant layer used in the solar cell module comprises the thermoplastic film or sheet 10 described above, which includes two surface layers 12 and 16 made of ionomers and/or acid copolymers and at least one inner layer 14 made of ethylene acrylate ester copolymers.

The optional second encapsulant layer, or any other additional encapsulant layers, comprised in the solar cell module of the present invention may be derived from any type of suitable films or sheets. Such suitable films or sheets include, but are not limited to, films or sheets comprising poly(vinyl butyral), ionomers, EVA, acoustic poly(vinyl acetal), acoustic poly(vinyl butyral), PVB, PU, PVC, metallocene-catalyzed linear low density polyethylenes, polyolefin block elastomers, ethylene acrylate ester copolymers, such as poly(ethylene-co-methyl acrylate) and poly(ethylene-co-butyl acrylate), acid copolymers, silicone elastomers and epoxy resins. In one particular embodiment, the optional second encapsulant layer is derived from the thermoplastic film or sheet of the present invention.

The thickness of each of the at least three sub-layers 12, 14, and 16, which make up the first encapsulant layer is not critical and may be independently varied depending on the particular application. Preferably, the two surface layers 12 and 16 made of acid copolymers and/or ionomers are minimized in thickness. Each of the two surface layers may independently have a thickness equal to or less than about 5 mils (0.13 mm), or preferably, equal to or less than about 3 mils (0.08 mm), or more preferably, equal to or less than about 2 mils (0.05 mm), or most preferably, equal to or less than about 1 mil (0.03 mm). The total thickness of the multilayer encapsulant layer film or sheet 10 may range from about 1 to about 120 mils (about 0.026 to about 3.00 mm), or preferably, from about 1 to about 40 mils (about 0.026 to about 1.02 mm), or more preferably, from about 1 to about 20 mils (about 0.026 to about 0.51 mm). The thinner multilayer encapsulant films will find the best utility within flexible solar cell modules, while the thicker multilayer encapsulant sheets will find the best utility in rigid solar cell modules.

The thickness of the optional second encapsulant layer, or any other additional encapsulant layers comprised in the solar cell module of the present invention is not critical and may be independently varied depending on the particular application. Typically, the second encapsulant layer of the present invention may have a thickness ranging from about 1 to about 120 mils (about 0.026 to about 3.00 mm), or preferably, from about 1 to about 40 mils (about 0.026 to about 1.02 mm), or more preferably, from about 1 to about 20 mils (about 0.026 to about 0.51 mm).

II. Surface Roughness:

The encapsulant layers comprised in the solar cell module of the present invention may have smooth or roughened surfaces. Preferably, the encapsulant layers have roughened surfaces to facilitate the de-airing of the laminates through the laminate process. The efficiency of the solar cell module is related to the appearance and transparency of the transparent front-sheet portion of the solar cell laminates and is an important feature in assessing the desirability of using the laminates. As described above, the front-sheet portion of the solar cell laminate includes the top incident layer, the front-sheet encapsulant layer, the solar cell layer (voltage-generating solar cell) and any other layers which are incorporated between the incident layer and the solar cell layer. One factor affecting the appearance of the front-sheet portion of the solar cell laminates is whether the laminate includes trapped air or air bubbles between the rear surface of the incident layer and the front-sheet encapsulant layer it is laminated thereto, or between the light-receiving surface of the solar cell layer and the front-sheet encapsulant layer to which it is laminated. It is desirable to remove air in an efficient manner during the lamination process. Providing channels for the escape of air and removing air during lamination is a known method for obtaining laminates with acceptable appearance.

This can be effected by mechanically embossing or by melt fracture during extrusion followed by quenching so that the roughness is retained during handling. Retention of the surface roughness is preferable in the practice of the present invention to facilitate effective de-airing of the entrapped air during laminate preparation.

Surface roughness, Rz, can be expressed in microns by a 10-point average roughness in accordance with ISO-R468 of the International Organization for Standardization and ASMEB46.1 of the American Society of Mechanical Engineers. For the thermoplastic sheets or films having a thickness of the present invention, 10-point average roughness, Rz, of up to 80 μm is sufficient to prevent air entrapment. The width of the channels may range from about 30 to about 300 μm, or preferably, from about 40 to about 250 μm, or more preferably, from about 50 to about 200 μm. The surface channels may be spaced from about 0.1 to about 1 mm apart, or preferably, from about 0.1 to about 0.9 mm apart, or more preferably, from about 0.15 to about 0.85 mm apart.

Surface roughness, Rz, measurements from single-trace profilometer measurements can be adequate in characterizing the average peak height of a surface with roughness peaks and valleys that are nearly randomly distributed. However a single trace profilometer may not be sufficient in characterizing the texture of a surface that has certain regularities, particularly straight lines. In characterizing such surfaces, if care is taken such that the stylus does not ride in a groove or on a plateau, the Rz thus obtained can still be a valid indication of the surface roughness. Other surface parameters, such as the mean spacing (R Sm) may not be accurate because they depend on the actual path traversed. Parameters like R Sm can change depending on the angle the traversed path makes with the grooves. Surfaces with regularities like straight-line grooves are better characterized by three-dimensional or area roughness parameters such as the area peak height, ARp, and the total area roughness, ARt, and the area kurtosis (AKu) as defined in ASME B46.1. ARp is the distance between the highest point in the roughness profile over an area to the plane if all the material constituting the roughness is melted down. ARt is the difference in elevation between the highest peak and the lowest valley in the roughness profile over the area measured. In the instant invention, the surface pattern of the encapsulant layer derived from the thermoplastic film or sheet 10 is characterized by ARt less than 32 μm, and the ratio of ARp to $AR_t$, also defined in ASME B46.1-1, may be between 0.42 and 0.62, or preferably, between 0.52 and 0.62. The surfaces of the encapsulant layer may also have area kurtosis of less than about 5.

The present invention can be suitably practiced with any of the surface patterns described above. The surface pattern is preferably an embossed pattern. The channel depth may range from about 2 to about 80 μm, or preferably, from about 2 to about 25 μm, or more preferably, from about 12 to about 20 μm, or most preferably, from about 14 to about 20 μm. The depth may be selected so that the regular channels provide suitable paths for air to escape during the lamination process. It is desirable therefore that the depth be sufficiently deep that the air pathways are not cut off prematurely during the heating stage of the lamination process, leading to trapped air in the laminate when it cools. Also, particularly when using the higher modulus polymeric layers comprising ionomers and/or acid copolymers as disclosed herein, it can be desirable to provide relatively shallow channels in comparison to, for example, EVA or PVB interlayer surface patterns. Larger channels provide larger reservoirs for air, and hence more air that requires removal during lamination.

The encapsulant layers can be embossed on one or both sides. The embossing pattern and/or the depth thereof can be asymmetric with respect to the two sides of the multilayer encapsulant layer. That is, the embossed patterns can be the same or different, as can be the depth of the pattern on either side of the multilayer encapsulant layers. In a specific embodiment, the surfaces of the encapsulant layer have an embossed pattern wherein the depth of the pattern on each side is in the range of from about 12 to about 20 μm. In another specific embodiment, there is an embossed pattern on one side of the encapsulant layer that is orthogonal to the edges of layer, while the identical embossed pattern on the opposite side of the encapsulant layer is slanted at some angle that is greater than or less than 90° to the edges. Offsetting the patterns in this manner can eliminate an undesirable optical effect in the layers.

In one particular embodiment, a surface pattern can be applied using a tool that imparts a pattern wherein the pattern requires less energy to obtain a flattened surface than conventional patterns. In the process of the present invention it is necessary to flatten the surface of the encapsulant layer during the lamination, so that the encapsulant layer surface is in complete contact with the opposing surface to which it is being laminated when the lamination process is complete. The energy required to obtain a smooth or flattened surface can vary depending upon the surface topography, as well as the type of material being flattened.

Conventional surface patterns or textures require a large percentage of the volume of the material that is raised above the imaginary plane of the flattened encapsulant layer sheet to flow to areas that lie below the imaginary plane. Encapsulant layer material that is above (primarily) and below the plane (which is the interface of the encapsulant layer and the layer to which it is being laminated to, (such as the solar cell layer, for example), after the lamination step is complete) must flow through a combination of heat, applied pressure, and time. Each particular pattern of different peak heights, spacing, volume, and other descriptors necessary to define the surface geometry will yield a corresponding amount of work or energy to compress the surface pattern. The goal is to prevent premature contact or sealing to occur prior to sufficient air removal being accomplished whether air removal is to be achieved by conventional techniques such as roll pre-pressing or vacuum bags/rings and the like.

In another embodiment, an encapsulant layer having a surface roughness that allows for high-efficiency de-airing but with less energy for compression (or at a controlled and desired level tailored for the pre-press/de-airing process) is obtained. One example of a surface pattern of the present invention comprises projections upward from the base surface as well as voids, or depressions, in the encapsulant layer surface. Such projections and depressions would be of similar or the same volume, and located in close proximity to other such projections and voids on the encapsulant layer surface. The projections and depressions may be located such that heating and compressing the encapsulant layer surface results in more localized flow of the thermoplastic material from an area of higher thermoplastic mass (that is, a projection) to a void area (that is, depression), wherein such voids would be filled with the mass from a local projection, resulting in the encapsulant layer surface being flattened. Localized flow of the thermoplastic resin material to obtain a flattened surface would require less of an energy investment than a more conventional pattern, which requires flattening of a surface by effecting mass flow of thermoplastic material across the entire surface of the encapsulant layer. The main feature is the ability for the pattern to be flattened with relative ease as compared with the conventional art.

Several different criteria are important in the design of an appropriate surface pattern or texture for handling, ease of positioning, blocking tendency, ease of cleaning, de-airing and possessing a robust process window for laminate manufacture.

The surface pattern, as described above, may be applied to the encapsulant layer through common art processes. For example, the extruded multilayer encapsulant layer may be passed over a specially prepared surface of a die roll positioned in close proximity to the exit of the die which imparts the desired surface characteristics to one side of the molten polymer. Thus, when the surface of such roll has minute peaks and valleys, the encapsulant layer formed of polymer cast thereon will have a rough surface on the side which contacts the roll which generally conforms respectively to the valleys and peaks of the roll surface. Such die rolls are disclosed in, for example, U.S. Pat. No. 4,035,549. As is known, this rough surface is only temporary and particularly functions to facilitate de-airing during laminating after which it is melted smooth from the elevated temperature and pressure associated with autoclaving and other lamination processes.

III. Solar Cells:

Solar cells are commonly available on an ever increasing variety as the technology evolves and is optimized. Within the present invention, a solar cell is meant to include any article which can convert light into electrical energy. Typical art examples of the various forms of solar cells include, for example, single crystal silicon solar cells, polycrystal silicon solar cells, microcrystal silicon solar cells, amorphous silicon based solar cells, copper indium selenide solar cells, compound semiconductor solar cells, dye sensitized solar cells, and the like. The most common types of solar cells include multi-crystalline solar cells, thin film solar cells, compound semiconductor solar cells and amorphous silicon solar cells due to relatively low cost manufacturing ease for large scale solar cells.

Thin film solar cells are typically produced by depositing several thin film layers onto a substrate, such as glass or a flexible film, with the layers being patterned so as to form a plurality of individual cells which are electrically interconnected to produce a suitable voltage output. Depending on the sequence in which the multi-layer deposition is carried out, the substrate may serve as the rear surface or as a front window for the solar cell module. By way of example, thin film solar cells are disclosed in U.S. Pat. Nos. 5,512,107; 5,948,176; 5,994,163; 6,040,521; 6,137,048; and 6,258,620.

Examples of thin film solar cell modules are those that comprise cadmium telluride or CIGS, (Cu(In—Ga)(SeS)2), thin film cells.

IV. Incident Layers. Back-sheet Layers, and Other Layers:

The solar cell module of the present invention may further comprise one or more sheet layers or film layers to serve as the incident layer, the back-sheet layer, and other additional layers.

The sheet layers, such as the incident and back-sheet layers, used herein may be glass or plastic sheets, such as, polycarbonate, acrylics, polyacrylate, cyclic polyolefins, such as ethylene norbornene polymers, metallocene-catalyzed polystyrene, polyamides, polyesters, fluoropolymers and the like and combinations thereof, or metal sheets, such as aluminum, steel, galvanized steel, and ceramic plates. Glass may serve as the incident layer of the solar cell laminate and the supportive back-sheet of the solar cell module may be derived from glass, rigid plastic sheets or metal sheets.

The term "glass" is meant to include not only window glass, plate glass, silicate glass, sheet glass, low iron glass, tempered glass, tempered CeO-free glass, and float glass, but also includes colored glass, specialty glass which includes ingredients to control, for example, solar heating, coated glass with, for example, sputtered metals, such as silver or indium tin oxide, for solar control purposes, E-glass, Toroglass, Solex® glass (a product of Solutia) and the like. Such specialty glasses are disclosed in, for example, U.S. Pat. Nos. 4,615,989; 5,173,212; 5,264,286; 6,150,028; 6,340,646; 6,461,736; and 6,468,934. The type of glass to be selected for a particular laminate depends on the intended use.

The film layers, such as the incident, back-sheet or other layers, used herein may be metal, such as aluminum foil, or polymeric. Preferable polymeric film materials include poly (ethylene terephthalate), polycarbonate, polypropylene, polyethylene, polypropylene, cyclic polyloefins, norbornene polymers, polystyrene, syndiotactic polystyrene, styrene-acrylate copolymers, acrylonitrile-styrene copolymers, poly (ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, ethylene-tetrafluoroethylene copolymers and the like. Most preferably, the polymeric film is bi-axially oriented poly(ethylene terephthalate) (PET) film, aluminum foil, or a fluoropolymer film, such as Tedlar® or Tefzel® films, which are commercial products of the E. I. du Pont de Nemours and Company. The polymeric film used herein may also be a multi-layer laminate material, such as a fluoropolymer/polyester/fluoropolymer (e.g., Tedlar®/Polyester/Tedlar®) laminate material or a fluoropolymer/polyester/EVA laminate material.

The thickness of the polymeric film is not critical and may be varied depending on the particular application. Generally, the thickness of the polymeric film will range from about 0.1 to about 10 mils (about 0.003 to about 0.26 mm). The polymeric film thickness may be preferably within the range of about 1 and about 4 mils (about 0.025 and about 0.1 mm).

The polymeric film is preferably sufficiently stress-relieved and shrink-stable under the coating and lamination processes. Preferably, the polymeric film is heat stabilized to provide low shrinkage characteristics when subjected to elevated temperatures (i.e. less than 2% shrinkage in both directions after 30 min at 150°).

The films used herein may serve as the incident layer (such as the fluoropolymer or poly(ethylene terephthalate) film) or the back-sheet (such as the fluoropolymer, aluminum foil, or poly(ethylene terephthalate) film). The films may also be included in the present solar cell module as dielectric layers or a barrier layers, such as oxygen or moisture barrier layers.

If desired, a layer of non-woven glass fiber (scrim) may be included in the present solar cell laminate to facilitate de-airing during the lamination process or to serve as reinforcement for the encapsulant layer(s). The use of such scrim layers within solar cell laminates is disclosed within, for example, U.S. Pat. Nos. 5,583,057; 6,075,202; 6,204,443; 6,320,115; 6,323,416; and European Patent No. 0 769 818.

V. Adhesives and Primers:

If desired, one or both surfaces of the solar cell laminate layers, such as the encapsulant layer(s), the incident layer, the back-sheet, and/or the solar cell layer may be treated to enhance the adhesion to other laminate layers. This treatment may take any form known within the art, including adhesives, primers, such as silanes, flame treatments, such as disclosed within U.S. Pat. Nos. 2,632,921; 2,648,097; 2,683,894; and 2,704,382, plasma treatments, such as disclosed within U.S. Pat. No. 4,732,814, electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof. For example, a thin layer of carbon may be deposited on one or both surfaces of the polymeric film through vacuum sputtering as disclosed in U.S. Pat. No. 4,865,711. Or, as disclosed in U.S. Pat. No. 5,415,942, a hydroxy-acrylic hydrosol primer coating that may serve as an adhesion-promoting primer for poly(ethylene terephthalate) films.

In a particular embodiment, the adhesive layer may take the form of a coating. The thickness of the adhesive/primer coating may be less than 1 mil, or preferably, less than 0.5 mil, or more preferably, less than 0.1 mil. The adhesive may be any adhesive or primer known within the art. Specific examples of adhesives and primers which may be useful in the present invention include, but are not limited to, gamma-chloropropylmethoxysilane, vinyltrichlorosilane, vinyltriethoxysilane, vinyltris(beta-methoxyethoxy)silane, gamma-methacryloxypropyltrimethoxysilane, beta-(3,4-epoxycyclohexyl)ethyltrimethoxysilane, gammaglycidoxypropyltrimethoxysilane, vinyl-triacetoxysilane, gamma-mercaptopropyltrimethoxysilane, gamma-aminopropyltriethoxysilane, N-beta-(aminoethyl)-gamma-aminopropyl-trimethoxysilane, glue, gelatine, caesin, starch, cellulose esters, aliphatic polyesters, poly(alkanoates), aliphatic-aromatic polyesters, sulfonated aliphatic-aromatic polyesters, polyamide esters, rosin/poly-caprolactone triblock copolymers, rosin/poly(ethylene adipate) triblock copolymers, rosin/poly(ethylene succinate) triblock copolymers, poly(vinyl acetates), poly(ethylene-co-vinyl acetate), poly(ethylene-co-ethyl acrylate), poly (ethylene-co-methyl acrylate), poly(ethylene-co-propylene), poly(ethylene-co-1-butene), poly(ethylene-co-1-pentene), poly(styrene), acrylics, polyurethanes, sulfonated polyester urethane dispersions, nonsulfonated urethane dispersions, urethane-styrene polymer dispersions, non-ionic polyester urethane dispersions, acrylic dispersions, silanated anionic acrylate-styrene polymer dispersions, anionic acrylate-styrene dispersions, anionic acrylate-styrene-acrylonitrile dispersions, acrylate-acrylonitrile dispersions, vinyl chloride-ethylene emulsions, vinylpyrrolidone/styrene copolymer emulsions, carboxylated and noncarboxylated vinyl acetate ethylene dispersions, vinyl acetate homopolymer dispersions, polyvinyl chloride emulsions, polyvinylidene fluoride dispersions, ethylene acrylic acid dispersions, polyamide dispersions, anionic carboxylated or noncarboxylated acrylonitrile-butadiene-styrene emulsions and acrylonitrile emulsions, resin dispersions derived from styrene, resin dispersions derived from aliphatic and/or aromatic hydrocarbons, styrene-maleic anhydrides, and the like and mixtures thereof.

In another particular embodiment, the adhesive or primer is a silane that incorporates an amine function. Specific examples of such materials include, but are not limited to, gamma-aminopropyltriethoxysilane, N-beta-(aminoethyl)-gamma-aminopropyl-trimethoxysilane, and the like and mixtures thereof. Commercial examples of such materials include, for example A-1100® silane, (from the Silquest Company, formerly from the Union Carbide Company, believed to be gamma-aminopropyltrimethoxysilane) and Z6020® silane, (from the Dow Corning Corp.).

The adhesives may be applied through melt processes or through solution, emulsion, dispersion, and the like, coating processes. One of ordinary skill in the art will be able to identify appropriate process parameters based on the composition and process used for the coating formation. The above process conditions and parameters for making coatings by any method in the art are easily determined by a skilled artisan for any given composition and desired application. For example, the adhesive or primer composition can be cast, sprayed, air knifed, brushed, rolled, poured or printed or the like onto the surface. Generally the adhesive or primer is diluted into a liquid medium prior to application to provide uniform coverage over the surface. The liquid media may function as a solvent for the adhesive or primer to form solutions or may function as a non-solvent for the adhesive or primer to form dispersions or emulsions. Adhesive coatings may also be applied by spraying the molten, atomized adhesive or primer composition onto the surface. Such processes are disclosed within the art for wax coatings in, for example, U.S. Pat. Nos. 5,078,313; 5,281,446; and 5,456,754.

VI. Solar Cell Laminate Constructions:

Notably, specific solar cell laminate constructions (top (light incident) side to back side) include, but are not limited to, glass/multilayer encapsulant layer of the present invention/solar cell/multilayer encapsulant layer of the present invention/glass; glass/multilayer encapsulant layer of the present invention/solar cell/multilayer encapsulant layer of the present invention/Tedlar® film; Tedlar® film/multilayer encapsulant layer of the present invention/solar cell/multilayer encapsulant layer of the present invention/glass; Tedlar® film/multilayer encapsulant layer of the present invention/solar cell/multilayer encapsulant layer of the present invention/Tedlar® film; glass/multilayer encapsulant layer of the present invention/solar cell/multilayer encapsulant layer of the present invention/PET film; Tedlar® film/multilayer encapsulant layer of the present invention/solar cell/multilayer encapsulant layer of the present invention/PET film; glass/multilayer encapsulant layer of the present invention/ solar cell/multilayer encapsulant layer of the present invention/barrier coated film/multilayer encapsulant layer of the present invention/glass; glass/ionomer encapsulant layer/solar cell/multilayer encapsulant layer of the present invention/ barrier coated film/multilayer encapsulant layer of the present invention/Tedlar® film; Tedlar® film/multilayer encapsulant layer of the present invention/barrier coated film/multilayer encapsulant layer of the present invention/solar cell/multilayer encapsulant layer of the present invention/barrier coated film/multilayer encapsulant layer of the present invention/ Tedlar® film; glass/multilayer encapsulant layer of the present invention/solar cell/multilayer encapsulant layer of the present invention/aluminum stock; Tedlar® film/multilayer encapsulant layer of the present invention/solar cell/ multilayer encapsulant layer of the present invention/aluminum stock; glass/multilayer encapsulant layer of the present invention/solar cell/multilayer encapsulant layer of the present invention/galvanized steel sheet; glass/multilayer encapsulant layer of the present invention/solar cell/multilayer encapsulant layer of the present invention/PET film/ multilayer encapsulant layer of the present invention/aluminum stock; Tedlar® film/multilayer encapsulant layer of the present invention/solar cell/multilayer encapsulant layer of the present invention/PET film/multilayer encapsulant layer of the present invention/aluminum stock; glass/multilayer encapsulant layer of the present invention/solar cell/multilayer encapsulant layer of the present invention/PET film/ multilayer encapsulant layer of the present invention/galvanized steel sheet; Tedlar®/multilayer encapsulant layer of the present invention/solar cell/multilayer encapsulant layer of the present invention/PET film/multilayer encapsulant layer of the present invention/galvanized steel sheet; glass/multilayer encapsulant layer of the present invention/solar cell/ acoustic poly(vinyl butyral) encapsulant layer/glass; glass/ multilayer encapsulant layer of the present invention/solar cell/poly(vinyl butyral) encapsulant layer/Tedlar® film; Tedlar® film/ionomer encapsulant layer/solar cell/multilayer encapsulant layer of the present invention/glass; Tedlar® film/multilayer encapsulant layer of the present invention/ solar cell/acid copolymer encapsulant layer/Tedlar® film; glass/multilayer encapsulant layer of the present invention/ solar cell/ethylene vinyl acetate encapsulant layer/PET film; Tedlar® film/multilayer encapsulant layer of the present invention/solar cell/poly(ethylene-co-methyl acrylate) encapsulant layer/PET film; glass/poly(ethylene-co-butyl acrylate) encapsulant layer/solar cell/multilayer encapsulant layer of the present invention/barrier coated film/poly(ethylene-co-butyl acrylate) encapsulant layer/glass; glass/multilayer encapsulant layer of the present invention/solar cell/ multilayer encapsulant layer of the present invention/ "Tedlar®/polyester/Tedlar®" tri-layer film; Tedlar® film/ multilayer encapsulant layer of the present invention/solar cell/multilayer encapsulant layer of the present invention/ "TediarO/polyester/Tedlar®" tri-layer film; glass/multilayer encapsulant layer of the present invention/solar cell/multilayer encapsulant layer of the present invention/"Tedlar®/ polyester/EVA" tri-layer film; Tedlar® film/multilayer encapsulant layer of the present invention/solar cell/multilayer encapsulant layer of the present invention/"Tedlar®/ polyester/EVA" tri-layer film; and the like.

Manufacture of Solar Cell Module or Laminate

In a further embodiment, the present invention is a process of manufacturing a solar cell module or laminate described above.

The solar cell laminates 30 of the present invention may be produced through autoclave and non-autoclave processes, as described below. For example, the solar cell constructs described above may be laid up in a vacuum lamination press and laminated together under vacuum with heat and standard atmospheric or elevated pressure.

Alternatively, the solar cell laminates may be formed by conventional autoclave processes known within the art. For example, in an exemplary process, a glass sheet, an encapsulant layer derived from the thermoplastic film or sheet 10, a solar cell layer, a second encapsulant layer, Tedlar® film, and a cover glass sheet are laminated together under heat and pressure and a vacuum (for example, in the range of about 27-28 inches (689-711 mm) Hg) to remove air. Preferably, the glass sheet has been washed and dried. A typical glass type is 90 mil thick annealed low iron glass. In an exemplary procedure, the laminate assembly of the present invention is placed into a bag capable of sustaining a vacuum ("a vacuum bag"), drawing the air out of the bag using a vacuum line or other means of pulling a vacuum on the bag, sealing the bag while maintaining the vacuum, placing the sealed bag in an autoclave at a temperature of about 130° C. to about 180° C., at a pressure of about 200 psi (15 bars) for from about 10 to about 50 minutes. Preferably the bag is autoclaved at a temperature of about 120° C. to about 160° C. for 20 to about 45 minutes, or more preferably, at a temperature of about 135° C. to about 160° C. for 20 to about 40 minutes, or most preferably, at a temperature of about 145° C. to about 155° C. for 25 to about 35 minutes. A vacuum ring may be substituted for the vacuum bag. One type of vacuum bags is disclosed within U.S. Pat. No. 3,311,517.

Any air trapped within the laminate assembly may be removed through a nip roll process. For example, the laminate assembly may be heated in an oven at a temperature of about 80° C. to about 120° C., or preferably, at a temperature of between about 90° C. and about 100° C., for about 30 minutes. Thereafter, the heated laminate assembly is passed through a set of nip rolls so that the air in the void spaces between the solar cell outside layers, the solar cell and the encapsulant layers may be squeezed out, and the edge of the assembly sealed. This process may provide the final solar cell laminate or may provide what is referred to as a pre-press assembly, depending on the materials of construction and the exact conditions utilized.

The pre-press assembly may then be placed in an air autoclave where the temperature is raised to about 120° C. to about 160° C., or preferably, between about 135° C. and about 160° C., and pressure to between about 100 and about 300 psig, or preferably, about 200 psig (14.3 bar). These conditions are maintained for about 15 minutes to about 1 hour, or preferably, about 20 to about 50 minutes, after which, the air is cooled while no more air is added to the autoclave. After about 20 minutes of cooling, the excess air pressure is vented and the solar cell laminates are removed from the autoclave. This should not be considered limiting. Essentially any lamination process known within the art may be used with the encapsulants of the present invention.

The solar cell laminates of the present invention may also be produced through non-autoclave processes. Such non-autoclave processes are disclosed, for example, within U.S. Pat. Nos. 3,234,062; 3,852,136; 4,341,576; 4,385,951; 4,398,979; 5,536,347; 5,853,516; 6,342,116; and 5,415,909, U.S. Patent Application No. 2004/0182493, European Patent No. EP 1 235 683 B1, and PCT Patent Application Nos. WO 91/01880 and WO 03/057478 A1. Generally, the non-autoclave processes include heating the laminate assembly or the pre-press assembly and the application of vacuum, pressure or both. For example, the pre-press may be successively passed through heating ovens and nip rolls.

If desired, the edges of the solar cell laminate may be sealed to reduce moisture and air intrusion and their potentially degradation effect on the efficiency and lifetime of the solar cell by any means disclosed within the art. General art edge seal materials include, but are not limited to, butyl rubber, polysulfide, silicone, polyurethane, polypropylene elastomers, polystyrene elastomers, block elastomers, styrene-ethylene-butylene-styrene (SEBS), and the like.

EXAMPLES

The following Examples and Comparative Examples are intended to be illustrative of the present invention, and are not intended in any way to limit the scope of the present invention. The solar cell interconnections are omitted from the examples below to clarify the structures, but any common art solar cell interconnections may be utilized within the present invention.

Methods

The following methods are used in the Examples and Comparative Examples presented hereafter.

I. Embossed Sheet Structure:

Embossed sheet structures were prepared on a 24 inch width Sano multilayer co-extrusion line equipped with embossing rolls utilizing common art sheet formation processes. This essentially entailed the use of an extrusion line consisting of a twin-screw extruder with a sheet die feeding melt into a calendar roll stack. The calendar rolls have an embossed surface pattern engraved into the metal surface which imparts to varying degrees a reverse image of the surface texture onto the polymer melt as it passes between and around the textured rolls. Both surfaces of the sheet were embossed with a pattern with the following characteristics:

Mound average depth: 21±4 micron
Mound peak depth: 25±5 micron
Pattern frequency/mm: 2
Mound width: 0.350±0.02 mm
Valley width: 0.140±0.02 mm Surface roughness, Rz, could be expressed in microns by a 10-point average roughness in accordance with ISO-R468 of the International Organization for Standardization. Roughness measurements were made using a stylus-type profilometer (Surfcom 1500A manufactured by Tokyo Seimitsu Kabushiki Kaisha of Tokyo, Japan) as described in ASME B46.1-1995 using a trace length of 26 mm. ARp and ARt, and the area kurtosis were measured by tracing the roughness over a 5.6 mm×5.6 mm area in 201 steps using the Perthometer Concept system manufactured by Mahr GmbH, Gottingen, Germany. The sheets therefore formed typically had an Rz in the range of from about 15 to about 25 micron.

II. Laminate Structure:

The laminate structures described in the following examples were produced in the following manner. Each layer making up a particular laminate structure was stacked (laid up) to form a pre-laminate structure. The pre-laminate structure was then placed within a vacuum bag, which was sealed and placed into an oven at room temperature (25° C.±5° C.). A vacuum was then applied to remove the air from the vacuum bag. While maintaining the application of the vacuum to the vacuum bag, the vacuum bag was heated at 135° C. for 1 hour. The vacuum was then discontinued and the vacuum bag removed from the oven and allowed to cool to room temperature (25° C.±5° C.). At this point, the laminate structure was formed and removed from the vacuum bag.

Examples 1-5 and Comparative Examples CE1-CE4

Examples 1-5 and Comparative Examples CE1-CE4 are a series of embossed tri-layer sheet structures, with their compositions listed in Table 1.

A variety of 4 inch×4 inch laminate structures comprising one of these embossed tri-layer sheets were then prepared to demonstrate various solar cell structures. The composition of these laminate structures are as follows: glass/Example/glass, fluoropolymer film/Example/glass, aluminum sheet/Example/glass, aluminum film/Example and glass/Example. The glass used was ⅛ inch (3.2 mm) thick Starphire®glass sheet (a commercial product of the PPG Corporation), the fluoropolymer film was 1.5 mil (0.38 mm) thick corona surface treated Tedlar® grade WH15BL3 (a product of the E. I. du Pont de Nemours and Company), and the aluminum sheet was ⅛ inch (3.2 mm) thick and was 5052 alloyed with 2.5 wt % of magnesium and conformed to Federal specification QQ-A-250/8 and ASTM B209.

TABLE 1

Tri-layer Sheet Structures

| Example | Surface Layers 1 mil (0.026 mm) | Inner Layer 18 mils (0.4 mm) |
|---|---|---|
| CE 1 | Ionomer 1 | Ionomer 2 |
| CE 2 | Ionomer 3 | Ionomer 2 |
| CE 3 | Ionomer 4 | Ionomer 2 |
| 1 | Ionomer 1 | EBA 1 |
| 2 | Ionomer 3 | EBA 1 |
| 3 | Ionomer 4 | EBA 1 |
| CE 4 | Ionomer 2 | Ionomer 5 |
| 4 | Ionomer 2 | EBA 1 |
| 5 | Ionomer 2 | EMA 1 |

Ionomer 1 was a poly(ethylene-co-methacrylic acid) containing 19 wt % of methacrylic acid that is 37% neutralized with sodium ion and having a MI of 2 g/10 min (190° C., ISO 1133, ASTM D1238).
Ionomer 2 was a poly(ethylene-co-methacrylic acid) containing 15 wt % of methacrylic acid that is 21% neutralized with zinc ion and having a MI of 5 g/10 min (190° C., ISO 1133, ASTM D1238).
Ionomer 3 was a poly(ethylene-co-methacrylic acid) containing 19 wt % of methacrylic acid that is 36% neutralized with zinc ion and having a MI of 1 g/10 min (190° C., ISO 1133, ASTM D1238).
Ionomer 4 was a poly(ethylene-co-methacrylic acid) containing 19 wt % of methacrylic acid that is 39% neutralized with zinc ion and having a MI of 4 g/10 min (190° C., ISO 1133, ASTM D1238).
Ionomer 5 was a poly(ethylene-co-iso-butyl acrylate-co-methacrylic acid) containing 10 wt % of iso-butyl acrylate and 10 wt % of methacrylic acid that is 16% neutralized with zinc ion and having a MI of 10 g/10 min (190° C., ISO 1133, ASTM D1238).
EBA 1 was a poly(ethylene-co-n-butyl acrylate) containing 27 wt % of n-butyl acrylate and having a MI of 4 g/10 min (190° C., ISO 1133, ASTM D1238).
EMA 1 was a poly(ethylene-co-methyl acrylate) having 30 wt % of methyl acrylate.

Example 6

Example 6 was an embossed tri-layer sheet consisting of two 2 mil (0.05 mm) thick surface layers of Ionomer 2 and one 16 mil (0.41 mm) thick inner layer of EBA 1. A series of 4 inch×4 inch laminate structures comprising the tri-layer sheet of Example 6 were then prepared. These laminate structures had the following compositions: glass/Example 6/glass, fluoropolymer film/Example 6/glass, aluminum sheet/Example 6/glass, aluminum sheet/Example 6, and glass/Example 6.

Example 7

Example 7 was an embossed tri-layer sheet consisting of two 4 mil (0.10 mm) thick surface layers of Ionomer 2 and one 12 mil (0.30 mm) thick inner layer of EBA 1. A series of 4 inch×4 inch laminate structures comprising the tri-layer sheet of Example 7 were then prepared. These laminate structures had the following compositions: glass/Example 7/glass, fluoropolymer film/Example 7/glass, aluminum sheet/Example 7/glass, aluminum sheet/Example 7, and glass/Example 7.

Examples 8-18

In Table 2, there are listed the compositions of a series of film structures (Examples 8-12) which are produced through a blown film process, as is commonly known within the art. Based on these film structures, a series of laminate structures (Examples 13-18, listed in Table 3) are prepared.

TABLE 2

Tri-layer Sheet Structures

| Example | Surface Layers (Thickness) | Inner Layer (Thickness) |
|---|---|---|
| 8 | Ionomer 2 0.5 mils (0.013 mm) | EBA 2 2 mils (0.05 mm) |
| 9 | Ionomer 3 1 mil (0.03 mm) | EEA 1 3 mils (0.08 mm) |
| 10 | Ionomer 6 0.7 mils (0.018 mm) | EMA 2 2 mils (0.05 mm) |
| 11 | ACR 1 0.5 mils (0.013 mm) | EBA 1 2 mils (0.05 mm) |
| 12 | ACR 2 1 mil (0.03 mm) | EMA 1 3 mils (0.08 mm) |

ACR 1 is a poly(ethylene-co-methacrylic acid) containing 12 wt % of methacrylic acid and having a MI of 1 g/10 min (190° C., ISO 1133, ASTM D1238).
ACR 2 is a poly(ethylene-co-methacrylic acid) containing 19 wt % of methacrylic acid and having a MI of 2 g/10 min (190° C., ISO 1133, ASTM D1238).
Ionomer 6 is a poly(ethylene-co-methacrylic acid) containing 21 wt % of methacrylic acid that is 30% neutralized with zinc ion and having a MI of 1 g/10 min (190° C., ISO 1133, ASTM D1238).
EBA 2 is a poly(ethylene-co-n-butyl acrylate) containing 30 wt % of n-butyl acrylate and having a MI of 1 g/10 min (190° C., ISO 1133, ASTM D1238).
EEA 1 is a poly(ethylene-co-ethyl acrylate) containing 32 wt % of ethyl acrylate and having a MI of 0.4 g/10 min (190° C., ISO 1133, ASTM D1238).
EMA 2 is a poly(ethylene-co-methyl acrylate containing 35 wt % of methyl acrylate and having a MI of 0.7 g/10 min (190° C., ISO 1133, ASTM D1238).

TABLE 3

Solar Cell Laminate Structures

| Example | Layer 1 | Layer 2 | Layer 3 | Layer 4 | Layer 5 |
|---|---|---|---|---|---|
| 13 | FPF | Example 8 | Solar Cell 1 | Example 8 | FPF |
| 14 | FPF | Example 9 | Solar Cell 2 | Example 9 | ALF |
| 15 | FPF | Example 10 | Solar Cell 3 | Example 10 | FPF |
| 16 | FPF | Example 10 | Solar Cell 4 | Example 8 | FPF |
| 17 | FPF | Example 11 | Solar Cell 1 | Example 11 | FPF |
| 18 | FPF | Example 12 | Solar Cell 4 | Example 12 | ALF |

ALF is an aluminum sheet (3.2 mm thick) and is 5052 alloyed with 2.5 wt % of magnesium and conforms to Federal specification QQ-A-250/8 and ASTM B209.
FPF is a corona surface treated Tedlar ® film grade WH15BL3 (1.5 mil (0.038 mm) thick), a product of the DuPont Corporation.
Solar Cell 1 is a 10 inch by 10 inch amorphous silicon photovoltaic device comprising a stainless steel substrate (125 μm thick) with an amorphous silicon semiconductor layer (U.S. Pat. No. 6,093,581, Example 1).
Solar Cell 2 is a 10 inch by 10 inch copper indium diselenide (CIS) photovoltaic device (Patent No. US 6,353,042, column 6, line 19).
Solar Cell 3 is a 10 inch by 10 inch cadmium telluride (CdTe) photovoltaic device (U.S. Pat. No. 6,353,042, column 6, line 49).
Solar Cell 4 is a silicon solar cell made from a 10 inch by 10 inch polycrystalline EFG-grown wafer (U.S. Pat. No. 6,660,930, column 7, line 61).

Examples 19-39

Examples 19-23 are a series of embossed sheet structures, listed below in Table 4. Examples 24-39, are a series of 12 inch×12 inch solar cell laminate structures, compositions of which are listed below in Table 5.

TABLE 4

Tri-layer Film Structures

| Example | Surface Layers (Thickness) | Inner Layer (Thickness) |
|---|---|---|
| 19 | Ionomer 2 0.5 mils (0.013 mm) | EBA 2 19 mils (0.48 mm) |
| 20 | Ionomer 3 1 mil (0.03 mm) | EEA 1 18 mils (0.4 mm) |
| 21 | Ionomer 6 0.7 mils (0.018 mm) | EMA 2 13 mils (0.33 mm) |

TABLE 4-continued

Tri-layer Film Structures

| Example | Surface Layers (Thickness) | Inner Layer (Thickness) |
|---|---|---|
| 22 | ACR 1 0.5 mils (0.013 mm) | EBA 1 19 mils (0.48 mm) |
| 23 | ACR 2 1 mil (0.03 mm) | EMA 1 18 mils (0.4 mm) |

TABLE 5

Solar Cell Laminate Structures

| Example | Layer 1 | Layer 2 | Layer 3 | Layer 4 | Layer 5 |
|---|---|---|---|---|---|
| 24, 40 | Glass 1 | Example 19 | Solar Cell 1 | Example 19 | Glass 1 |
| 25, 41 | Glass 2 | Example 20 | Solar Cell 2 | Example 20 | Glass 2 |
| 26, 42 | Glass 1 | Example 21 | Solar Cell 3 | Example 21 | Glass 2 |
| 27, 43 | Glass 1 | Example 22 | Solar Cell 4 | Example 22 | Glass 2 |
| 28, 44 | Glass 1 | Example 23 | Solar Cell 1 | Example 23 | ALF |
| 29, 45 | Glass 2 | Example 19 | Solar Cell 2 | EBA 3 | ALF |
| 30, 46 | Glass 2 | Example 20 | Solar Cell 3 | EMA 3 | ALF |
| 31, 47 | Glass 1 | Example 21 | Solar Cell 4 | EVA | ALF |
| 32, 48 | FPF | Example 22 | Solar Cell 1 | PVB | ALF |
| 33, 49 | FPF | Example 23 | Solar Cell 2 | Example 23 | ALF |
| 34, 50 | Glass 1 | Ionomer 8 | Solar Cell 1 | Example 19 | Glass 3 |
| 35, 51 | Glass 1 | Example 20 | Solar Cell 4 | Ionomer 7 | Glass 2 |
| 36, 52 | Glass 1 | Example 21 | Solar Cell 1 | PVB | Glass 2 |
| 37, 53 | Glass 2 | Example 22 | Solar Cell 4 | PVB A | Glass 2 |
| 38, 54 | FPF | Example 23 | Solar Cell 1 | PVB S | Glass 2 |
| 39, 55 | Glass 1 | Example 19 | Solar Cell 1 | Example 19 | Glass 3 |

ACR 3 is a 20 mil (0.51 mm) thick embossed sheet of a poly(ethylene-co-methacrylic acid) containing 15 wt % of methacrylic acid and having a MI of 5.0 g/10 min (190° C., ISO 1133, ASTM D1238).
EBA 3 is a formulated composition based on poly(ethylene-co-butyl acrylate) containing 20 wt % of butyl acrylate in the form of 20 mil (0.51 mm) thick sheet.
EMA 3 is a formulated composition based on poly(ethylene-co-methyl acrylate) containing 20 wt % of methyl acrylate in the form of 20 mil (0.51 mm) thick sheet.
EVA is SC50B, believed to be a formulated composition based on poly(ethylene-co-vinyl acetate) in the form of 20 mil (0.51 mm) thick sheet (a product of the Hi-Sheet Corporation, formerly Mitsui Chemicals Fabro, Inc.).
Glass 1 is Starphire ® glass (3.2 mm thick) from the PPG Corporation.
Glass 2 is a clear annealed float glass plate layer (2.5 mm thick).
Glass 3 is a Solex ® solar control glass (3.0 mm thick).
Ionomer 7 is a 90 mil (2.25 mm) thick embossed sheet of a poly(ethylene-co-methacrylic acid) containing 18 wt % of methacrylic acid that is 30% neutralized with zinc ion and having a MI of 1 g/10 min (190° C., ISO 1133, ASTM D1238).
Ionomer 1 is prepared from a poly(ethylene-co-methacrylic acid) having a MI of 60 g/10 min (190° C., ISO 1133, ASTM D1238).
Ionomer 8 is a 20 mil (0.51 mm) thick embossed sheet of a poly(ethylene-co-methacrylic acid) containing 22 wt % of methacrylic acid that is 26% neutralized with zinc ion and having a MI of 0.75 g/10 min (190° C., ISO 1133, ASTM D1238).
Ionomer 2 is prepared from a poly(ethylene-co-methacrylic acid) having a MI of 60 g/10 min (190° C., ISO 1133, ASTM D1238).
PVB is B51V, believed to be a formulated composition based on poly(vinyl butyral) in the form of 20 mil (0.51 mm) thick sheet (a product of the DuPont Corporation).
PVB A is an acoustic poly(vinyl butyral) sheet including 100 parts per hundred (pph) poly(vinyl butyral) with a hydroxyl number of 15 plasticized with 48.5 pph plasticizer tetraethylene glycol diheptanoate prepared similarly to that disclosed within PCT Patent Application No. WO 2004/039581.
PVB S is a 20 mil (0.51 mm) thick stiff poly(vinyl butyral) sheet prepared similarly to that disclosed in Example 2 of PCT Patent Application No. WO 03/078160.

Examples 40-55

As listed in Table 5, examples 40-55 are a series of 12 inch×12 inch solar cell laminate structures similar to those of examples 24-39, except that each of the laminate structures of examples 40-55 includes a flexible film as a surface layer. In the preparation of these solar cell laminate, a 3 mm thick glass cover sheet is added to the laminate structure and then removed after the lamination process.

What is claimed is:

1. A solar cell module comprising:
(a) a first encapsulant layer comprising a thermoplastic film or sheet consisting of two surface layers and one inner layer, wherein (i) each of said two surface layers consists essentially of an acid copolymer, an ionomer, or a combination thereof; and (ii) said one inner layer consists essentially of an ethylene acrylate ester copolymer;
(b) a solar cell layer comprising one or a plurality of electronically interconnected solar cells and having two opposite surfaces, a light-receiving surface and a rear surface; and
(c) an optional second encapsulant layer;
wherein when said optional second encapsulant layer is present said first and optional second encapsulant layers are laminated to each of said two opposite surfaces of said solar cell layer;
wherein said acid copolymer comprises a finite amount of polymerized residues of an α-olefin and greater than or equal to about 1 wt% of polymerized residues of an α, β-ethylenically unsaturated carboxylic acid, based on a total weight of said acid copolymer; and
wherein said ionomer is a derivative of a parent acid copolymer comprising a finite amount of polymerized residues of an α-olefin and greater than or equal to about 10 wt% of polymerized residues of an α, β-ethylenically unsaturated carboxylic acid, based on a total weight of said parent acid copolymer and having about 10 to 100% of a total carboxylic acid content neutralized with metallic ions.

2. The solar cell module of claim 1, wherein said two surface layers are chemically distinct.

3. The solar cell module of claim 1, wherein at least one layer of said two surface layers is derived from a composition comprising an ionomer.

4. The solar cell module of claim 3, wherein both of said two surface layers are derived from compositions comprising ionomers.

5. The solar cell module of claim 1, wherein said surface layers of said first encapsulant layer consist essentially of said acid copolymer.

6. The solar cell module of claim 1, wherein said surface layers of said first encapsulant layer consist essentially of said ionomer.

7. The solar cell module of claim 1, wherein at least one surface of said thermoplastic film or sheet is a rough surface.

8. The solar cell module of claim 1, wherein both surfaces of said thermoplastic film or sheet are rough surfaces.

9. The solar cell module of claim 1, wherein said ethylene acrylate ester copolymer comprises a finite amount of polymerized residues of ethylene and about 15 to about 40 wt% of polymerized residues of an acrylate ester, based on a total weight of said ethylene acrylate ester copolymer, wherein the acrylate ester is selected from the group consisting of methyl acrylate, methyl methacrylate, ethyl acrylate, ethyl ethacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol)acrylate, poly(ethylene glycol)methacrylate, poly(ethylene glycol) methyl ether acrylate, poly(ethylene glycol) methyl ether methacrylate, poly(ethylene glycol) behenyl ether acrylate, poly(ethylene glycol) behenyl ether methacrylate, poly(ethylene glycol) 4-nonylphenyl ether acrylate, poly(ethylene glycol) 4-nonylphenyl ether methacrylate, poly(ethylene glycol) phenyl ether acrylate, poly(ethylene glycol) phenyl ether methacrylate, dimethyl maleate, diethyl maleate, dibutyl maleate, dimethyl fumarate, diethyl fumarate, dibutyl fumarate, dimenthyl fumarate, and combinations thereof.

10. The solar cell module of claim 9, wherein both of said two surface layers comprise said ionomer and wherein said ionomer is a derivative of a parent acid copolymer comprising a finite amount of polymerized residues of ethylene and about 15 wt to about 25 wt% of an α, β-ethylenically unsaturated carboxylic acid selected from the group consisting of acrylic acids, methacrylic acids and mixtures thereof, based on a total weight of said parent acid copolymer and having about 10 to about 50% of a total carboxylic acid content neutralized with metallic ions selected from the group consisting of sodium, lithium, magnesium, zinc, aluminum, and mixtures thereof.

11. The solar cell module of claim 9, wherein both of said two surface layers comprise said acid copolymer and said acid copolymer comprises a finite amount of polymerized residues of an ethylene and about 18 to about 23 wt % of polymerized residues of an α, β-ethylenically unsaturated carboxylic acid selected from the group consisting of acrylic acids, methacrylic acids and mixtures thereof, based on a total weight of said acid copolymer.

12. The solar cell module of claim 1, wherein said ethylene acrylate ester copolymer comprises a finite amount of polymerized residues of ethylene and about 25 to about 40 wt % of polymerized residues of an acrylate ester, based on a total weight of said ethylene acrylate ester copolymer, wherein the acrylate ester is selected from the group consisting of methyl acrylate, ethyl acrylate, isopropyl acrylate, butyl acrylate and combinations thereof.

13. The solar cell module of claim 12, wherein said ionomer is a derivative of a parent acid copolymer comprising a finite amount of polymerized residues of ethylene and about 15 wt to about 25 wt % of an α, β-ethylenically unsaturated carboxylic acid selected from the group consisting of acrylic acids, methacrylic acids and mixtures thereof, based on a total weight of said parent acid copolymer and having about 10 to about 50% of a total carboxylic acid content neutralized with metallic ions selected from the group consisting of sodium, lithium, magnesium, zinc, aluminum, and mixtures thereof.

14. The solar cell module of claim 12, wherein both of said two surface layers comprise said acid copolymer and said acid copolymer comprises a finite amount of polymerized residues of an ethylene and about 18 to about 23 wt % of polymerized residues of an α, β-ethylenically unsaturated carboxylic acid selected from the group consisting of acrylic acids, methacrylic acids and mixtures thereof, based on a total weight of said acid copolymer.

15. A solar cell module comprising:
(a) a first encapsulant layer comprising a thermoplastic film or sheet consisting of two surface layers and one inner layer, wherein (i) each of said two surface layers consists essentially of an acid copolymer, an ionomer, or a combination thereof; and (ii) said one inner layer consists essentially of an ethylene acrylate ester copolymer;
(b) a solar cell layer comprising one or a plurality of electronically interconnected solar cells and having two opposite surfaces, a light-receiving surface and a rear surface; and
(c) an optional second encapsulant layer, wherein said first and optional second encapsulant layers are laminated to each of said two opposite surfaces of said solar cell layer;
wherein said ethylene acrylate ester copolymer comprises a finite amount of polymerized residues of ethylene and about 15 wt to about 40 wt % of polymerized residues of an acrylate ester, based on a total weight of said ethylene acrylate ester copolymer, wherein the acrylate ester is selected from the group consisting of methyl acrylate, methyl methacrylate, ethyl acrylate, ethyl ethacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol)acrylate, poly(ethylene glycol)methacrylate, poly (ethylene glycol) methyl ether acrylate, poly(ethylene glycol) methyl ether methacrylate, poly(ethylene glycol) behenyl ether acrylate, poly(ethylene glycol) behenyl ether methacrylate, poly(ethylene glycol) 4-nonylphenyl ether acrylate, poly(ethylene glycol) 4-nonylphenyl ether methacrylate, poly(ethylene glycol) phenyl ether acrylate, poly(ethylene glycol) phenyl ether methacrylate, dimethyl maleate, diethyl maleate, dibutyl maleate, dimethyl fumarate, diethyl fumarate, dibutyl fumarate, dimenthyl fumarate, and combinations thereof.

16. The solar cell module of claim 15, wherein said first encapsulant layer is laminated to said light-receiving surface of said solar cell layer and, when present, said optional second encapsulant layer is laminated to said rear surface of said solar cell layer.

17. The solar cell module of claim 16, further comprising (iv) an incident layer laminated to said first encapsulant layer and away from said solar cell layer, and (v) a back-sheet laminated to said rear surface of said solar cell layer, or to said optional second encapsulant layer and away from said solar cell layer when said optional second encapsulant layer is present.

18. The solar cell module of claim 17, wherein said incident layer is made of transparent material.

19. The solar cell module of claim 18, wherein said transparent material is selected from the group consisting of glass and fluoropolymers.

20. The solar cell module of claim 17, wherein said back-sheet is made of a sheet or film selected from the group consisting of glass, plastic sheets or films, and metal sheets or films.

21. The solar cell module of claim 15, wherein said solar cells are selected from the group consisting of multi-crystalline solar cells, thin film solar cells, compound semiconductor solar cells, and amorphous silicon solar cells.

22. The solar cell module of claim 15, wherein said optional second encapsulant layer is present and comprises a thermoplastic film or sheet consisting of two surface layers and one inner layer, wherein (i) each of said two surface layers consists essentially of an acid copolymer, an ionomer, or a combination thereof; and (ii) said one inner layer consists essentially of said ethylene acrylate ester copolymer.

23. The solar cell module of claim 15, wherein said optional second encapsulant layer is present and comprises a film or sheet comprising a composition selected from the group consisting of poly(vinyl butyral), ionomers, ethylene vinyl acetate thermoplastic polyurethane, polyvinylchloride, metallocene-catalyzed linear low density polyethylenes, polyolefin block elastomers, ethylene acrylate ester copolymers, acid copolymers, silicone elastomers and epoxy resins.

24. A solar cell module consisting essentially of, from top to bottom: (i) an incident layer made of transparent material, which is laminated to, (ii) a first encapsulant layer, which is laminated to, (iii) a solar cell layer comprising one or a plurality of electronically interconnected solar cells, which is laminated to, (iv) an optional second encapsulant layer or (v) a back-sheet, and when said optional second encapsulant layer is present, said optional second encapsulant layer is laminated to said back sheet;
   wherein said first encapsulant layer comprises a thermoplastic film or sheet consisting of two surface layers and one inner layer, wherein (a) each of said two surface layers consists essentially of an acid copolymer, an ionomer, or a combination thereof; and (b) said one inner layer consists essentially of an ethylene acrylate ester copolymer; and
   wherein said ethylene acrylate ester copolymer comprises a finite amount of polymerized residues of ethylene and about 15 to about 40 wt % of polymerized residues of an acrylate ester, based on a total weight of said ethylene acrylate ester copolymer, wherein the acrylate ester is selected from the group consisting of methyl acrylate, methyl methacrylate, ethyl acrylate, ethyl ethacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol)acrylate, poly(ethylene glycol)methacrylate, poly(ethylene glycol) methyl ether acrylate, poly(ethylene glycol) methyl ether methacrylate, poly(ethylene glycol) behenyl ether acrylate, poly(ethylene glycol) behenyl ether methacrylate, poly(ethylene glycol) 4-nonylphenyl ether acrylate, poly(ethylene glycol) 4-nonylphenyl ether methacrylate, poly(ethylene glycol) phenyl ether acrylate, poly(ethylene glycol) phenyl ether methacrylate, dimethyl maleate, diethyl maleate, dibutyl maleate, dimethyl fumarate, diethyl fumarate, dibutyl fumarate, dimenthyl fumarate, and combinations thereof.

25. A process of manufacturing a solar cell module comprising: (i) providing an assembly comprising from top to bottom an incident layer, a first encapsulant layer, a solar cell layer comprising one or a plurality of electronically interconnected solar cells, an optional second encapsulant layer, and a back-sheet and (ii) laminating the assembly to form the solar cell module;
   wherein said first encapsulant layer comprises a thermoplastic film or sheet consisting of two surface layers and one inner layer, wherein (a) each of said two surface layers consists essentially of an acid copolymer, an ionomer, or a combination thereof; and (b) said one inner layer consists essentially of an ethylene acrylate ester copolymer; and
   wherein said ethylene acrylate ester copolymer comprises a finite amount of polymerized residues of ethylene and about 15 to about 40 wt % of polymerized residues of an acrylate ester, based on a total weight of said ethylene acrylate ester copolymer, wherein the acrylate ester is selected from the group consisting of methyl acrylate, methyl methacrylate, ethyl acrylate, ethyl ethacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol)acrylate, poly(ethylene glycol)methacrylate, poly(ethylene glycol) methyl ether acrylate, poly(ethylene glycol) methyl ether methacrylate, poly(ethylene glycol) behenyl ether acrylate, poly(ethylene glycol) behenyl ether methacrylate, poly(ethylene glycol) 4-nonylphenyl ether acrylate, poly(ethylene glycol) 4-nonylphenyl ether methacrylate, poly(ethylene glycol) phenyl ether acrylate, poly(ethylene glycol) phenyl ether methacrylate, dimethyl maleate, diethyl maleate, dibutyl maleate, dimethyl fumarate, diethyl fumarate, dibutyl fumarate, dimenthyl fumarate, and combinations thereof.

26. The process of claim 25, wherein the step (ii) of lamination is conducted by subjecting the assembly to heat.

27. The process of claim 26, wherein the step (ii) of lamination further comprising subjecting the assembly to pressure.

28. The process of claim 26, wherein the step (ii) of lamination further comprising subjecting the assembly to vacuum.

29. A solar cell module consisting essentially of, from top to bottom: (i) an incident layer made of transparent material, which is laminated to, (ii) a first encapsulant layer, which is laminated to, (iii) a solar cell layer comprising one or a plurality of electronically interconnected solar cells, which is laminated to, (iv) an optional second encapsulant layer or (v) a back-sheet, and when said optional second encapsulant layer is present, said optional second encapsulant layer is laminated to said back sheet;
   wherein said first encapsulant layer comprises a thermoplastic film or sheet consisting of two surface layers and one inner layer, wherein (a) each of said two surface layers consists essentially of an acid copolymer, an ionomer, or a combination thereof; and (b) said one inner layer consists essentially of an ethylene acrylate ester copolymer;
   wherein acid copolymer comprises a finite amount of polymerized residues of an α-olefin and greater than or equal to about 1 wt % of polymerized residues of an α, β-ethylenically unsaturated carboxylic acid, based on a total weight of said acid copolymer; and
   wherein said ionomer is a derivative of a parent acid copolymer comprising a finite amount of polymerized residues of an α-olefin and greater than or equal to about 10 wt % of polymerized residues of an α, β-ethylenically unsaturated carboxylic acid, based on a total weight of said parent acid copolymer and having about 10 to 100% of a total carboxylic acid content neutralized with metallic ions.

30. A process of manufacturing a solar cell module comprising: (i) providing an assembly comprising from top to bottom an incident layer, a first encapsulant layer, a solar cell layer comprising one or a plurality of electronically interconnected solar cells, an optional second encapsulant layer, and a back-sheet and (ii) laminating the assembly to form the solar cell module;

wherein acid copolymer comprises a finite amount of polymerized residues of an α-olefin and greater than or equal to about 1 wt % of polymerized residues of an α, β-ethylenically unsaturated carboxylic acid, based on a total weight of said acid copolymer; and wherein said ionomer is a derivative of a parent acid copolymer comprising a finite amount of polymerized residues of an α-olefin and greater than or equal to about 10 wt % of polymerized residues of an α, β-ethylenically unsaturated carboxylic acid, based on a total weight of said parent acid copolymer and having about 10 to 100% of a total carboxylic acid content neutralized with metallic ions.

31. The process of claim 30, wherein said ethylene acrylate ester copolymer comprises a finite amount of polymerized residues of ethylene and about 15 to about 40 wt % of polymerized residues of an acrylate ester, based on a total weight of said ethylene acrylate ester copolymer, wherein the acrylate ester is selected from the group consisting of methyl acrylate, methyl methacrylate, ethyl acrylate, ethyl ethacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol)acrylate, poly(ethylene glycol)methacrylate, poly(ethylene glycol) methyl ether acrylate, poly(ethylene glycol) methyl ether methacrylate, poly(ethylene glycol) behenyl ether acrylate, poly(ethylene glycol) behenyl ether methacrylate, poly(ethylene glycol) 4-nonylphenyl ether acrylate, poly(ethylene glycol) 4-nonylphenyl ether methacrylate, poly(ethylene glycol) phenyl ether acrylate, poly(ethylene glycol) phenyl ether methacrylate, dimethyl maleate, diethyl maleate, dibutyl maleate, dimethyl fumarate, diethyl fumarate, dibutyl fumarate, dimenthyl fumarate, and combinations thereof;

wherein said acid copolymer and said acid copolymer comprises a finite amount of polymerized residues of an ethylene and about 18 to about 23 wt % of polymerized residues of an α, β-ethylenically unsaturated carboxylic acid selected from the group consisting of acrylic acids, methacrylic acids and mixtures thereof, based on a total weight of said acid copolymer; and wherein said ionomer is a derivative of a parent acid copolymer comprising a finite amount of polymerized residues of ethylene and about 15 wt to about 25 wt % of an α, β-ethylenically unsaturated carboxylic acid selected from the group consisting of acrylic acids, methacrylic acids and mixtures thereof, based on a total weight of said parent acid copolymer and having about 10 to about 50% of a total carboxylic acid content neutralized with metallic ions selected from the group consisting of sodium, lithium, magnesium, zinc, aluminum, and mixtures thereof.

32. The process of claim 31, wherein said ethylene acrylate ester copolymer comprises a finite amount of polymerized residues of ethylene and about 25 to about 40 wt % of polymerized residues of an acrylate ester, based on a total weight of said ethylene acrylate ester copolymer, wherein the acrylate ester is selected from the group consisting of methyl acrylate, ethyl acrylate, isopropyl acrylate, butyl acrylate and combinations thereof.

* * * * *